United States Patent [19]
Ishida et al.

[11] Patent Number: 5,777,407
[45] Date of Patent: Jul. 7, 1998

[54] ALTERNATOR FOR VEHICLE

[75] Inventors: Hiroshi Ishida, Anjyo; Tooru Ooiwa, Toyota, both of Japan

[73] Assignee: Nippondenso Co., Ltd., Kariya, Japan

[21] Appl. No.: 764,596

[22] Filed: Dec. 11, 1996

Related U.S. Application Data

[63] Continuation of Ser. No. 401,919, Mar. 9, 1995, abandoned.

[30] Foreign Application Priority Data

| Mar. 11, 1994 | [JP] | Japan | 6-067894 |
| Feb. 3, 1995 | [JP] | Japan | 7-017240 |

[51] Int. Cl.⁶ .............................. H02N 9/06; H02N 11/00
[52] U.S. Cl. .............................. 310/64; 310/68 D; 310/89; 310/62
[58] Field of Search .............................. 310/64, 680, 62, 310/89

[56] References Cited

U.S. PATENT DOCUMENTS

| 3,198,972 | 8/1965 | Larson . | |
| 4,065,686 | 12/1977 | Moore | 310/68 D |
| 4,419,597 | 12/1983 | Shiga et al. | 310/68 D |
| 4,488,070 | 12/1984 | Iwaki et al. | 310/62 |
| 4,549,103 | 10/1985 | Shiga | 310/60 R |
| 4,604,538 | 8/1986 | Merrill et al. | 310/68 D |
| 4,841,182 | 6/1989 | Tsuchiya et al. | 310/68 D |
| 4,952,828 | 8/1990 | Yu-Fang et al. | 310/68 D |
| 4,959,571 | 9/1990 | Yasumoto et al. | 310/67 R |
| 4,961,016 | 10/1990 | Peng et al. | 310/62 |
| 5,043,614 | 8/1991 | Yockey | 310/68 D |
| 5,451,823 | 9/1995 | Deverall et al. | 310/68 D |
| 5,473,208 | 12/1995 | Stihi | 310/68 D |

FOREIGN PATENT DOCUMENTS

| 125834 | 11/1984 | European Pat. Off. . |
| 388953 | 9/1990 | European Pat. Off. . |
| 55-66249 | 5/1980 | Japan . |
| 55-97169 | 7/1980 | Japan . |

*Primary Examiner*—Steven L. Stephan
*Assistant Examiner*—Michael J. Wallace, Jr.
*Attorney, Agent, or Firm*—Cushman, Darby & Cushman IP Group of Pillsbury Madison & Sutro LLP

[57] ABSTRACT

A rectifying unit is disposed axially adjacent to a rear cooling fan. The rectifying unit has a plus-pole heat dissipating fin and a minus-pole heat dissipating fin integrally connected by a terminal plate. The plus-pole heat dissipating fin has an elongation extending axially around the rear cooling fan to have direct cooling air from the fan. The minus-pole heat dissipating fin is fixed to the housing directly or via a heat conductive material to be electrically grounded. Slits are formed on the elongations of the plus-pole heat dissipating fin to have discharging cooling air therethrough. Further, elongations are formed on the both dissipating fins at their inner periphery proximate to an intake window of the housing. Thus, cooling capacity of the rectifying unit is enhanced.

31 Claims, 9 Drawing Sheets

5,777,407

1

ALTERNATOR FOR VEHICLE

This is a continuation of application Ser. No. 08/401,919, filed on Mar. 9, 1995, now abandoned.

CROSS REFERENCE TO RELATED APPLICATION

The present application is based on and claims priority from Japanese Patent Application No. Hei 7-17240 filed on Feb. 3, 1995, the contents of which are incorporated herein by reference.

BACKGROUND OF THE INVENTION

1. Field of the Invention

The present invention relates to an alternator for a vehicle, and particularly, to a cooling structure of a rectifying unit installed in an alternator for a vehicle.

2. Description of the Related Art

In order to have a sufficient space in the vehicle passenger compartment, the volume or axial length of the engine compartment has been reduced and, consequently, the reduction in the axial length of the various accessories installed in the engine compartment which include an alternator has been required.

However, the reduction in the engine compartment size causes an increase in the temperature of the engine compartment. In addition, the reduction in the alternator axial length may cause its cooling structure to become narrower and more complicated which can be detrimental to the cooling of the alternator components.

Now, a conventional alternator for a vehicle is described with reference to FIGS. 9 and 10. A pair of alternator housings 100 and 100' hold therein a stator 200 which has a stator core 200a and stator coil 200b. A rotor 400 has a rotor core 400a, a rotor coil 400b and rotary shaft 300, and is disposed to rotate in the stator 200. A pair of horseshoe cooling fins 150 and 150' are fixed to the housing 100' at a portion facing an end of the rotor 400, and diodes 120 and 120' are disposed on the cooling fins 150 and 150'. A cooling fan 800 is secured to the same end of the rotor 400. A horseshoe terminal plate 130 is secured to the housing 100' to hold the cooling fins 150 and 150'. The terminal plate 130 has terminals 160 which have connecting portions 160c (shown in FIG. 10) connecting the diodes 120 and 120' to the stator coil 200b. At a surface of the terminal plate 130 which faces the cooling fan 800 at a small distance, a guide surface member 130a is formed to function as a side plate of the ventilation fan 800. The connecting portions 160c are disposed radially outside the guide surface member 130a.

Another prior art alternator is disclosed in U.S. Pat. No. 3,198,972, which discloses heat dissipation plates of diodes disposed in the cooling air passages.

In the former alternator for a vehicle, cooling air sucked into the housing by a cooling fan touches the cooling fin 150 and 150' for the diodes 120 and 120' and cooling air discharged by the cooling fan does not directly touch the cooling fins for the diodes.

Air discharging windows 158 of the latter alternator are formed only on a portion of the housing 100 around the stator coil 200. Therefore, the cooling air flow is obstructed by the stator coil 200.

SUMMARY OF THE INVENTION

The present invention has a primary object to provide an alternator for a vehicle in which cooling capacity of the rectifying unit is enhanced.

2

Another object of the present invention is to provide an alternator for a vehicle in which a cooling fan directly blows cooling air on cooling fins and diodes to increase the cooling effect.

Another object of the present invention is to provide an alternator for a vehicle in which the cooling air passage between an air intake window and an air discharging window is formed without obstacle thereby increasing the volume of the cooling air.

Another object of the present invention is to provide an alternator for a vehicle in which a portion of a plus-pole heat dissipating fin has an elongation extending axially around a cooling fan proximate to the air discharging window, and a minus-pole heat dissipating fin is secured directly or through a heat conductive material to the housing proximate the air intake window.

A further object of the present invention is to provide an alternator for a vehicle in which the elongation of the plus-pole heat dissipating fin has a slit to increase the volume of the cooling air.

A still further object of the present invention is to provide an alternator for a vehicle in which the plus-pole and minus pole heat dissipating fins have slits or through holes proximate the air intake window to increase volume of the cooling air.

A still further object of the present invention is to provide an alternator for a vehicle in which diodes are disposed at portions facing the cooling fan to directly receive air flow of the cooling fan.

A further object of the present invention is to provide an alternator for a vehicle in which the plus-pole heat dissipating fin is disposed on top of the minus-pole heat dissipating fin.

A still further object of the present invention is to provide an alternator for a vehicle in which portions of the plus-pole and minus-pole are disposed in an air passage between the cooling fan and the air intake portion.

A further object of the present invention is to provide an alternator for a vehicle in which the cooling fan has first fan blades discharging cooling air toward the rectifying unit and second fan blades.

A still further object of the present invention is to provide an alternator for a vehicle in which the diodes of said plus-pole heat dissipating fin and the diodes of the minus-pole heat dissipating fin are disposed at a distance in the radial direction from one another.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENT

A preferred embodiment according to the present invention will now be described with reference to the appended drawings.

Figure 1:
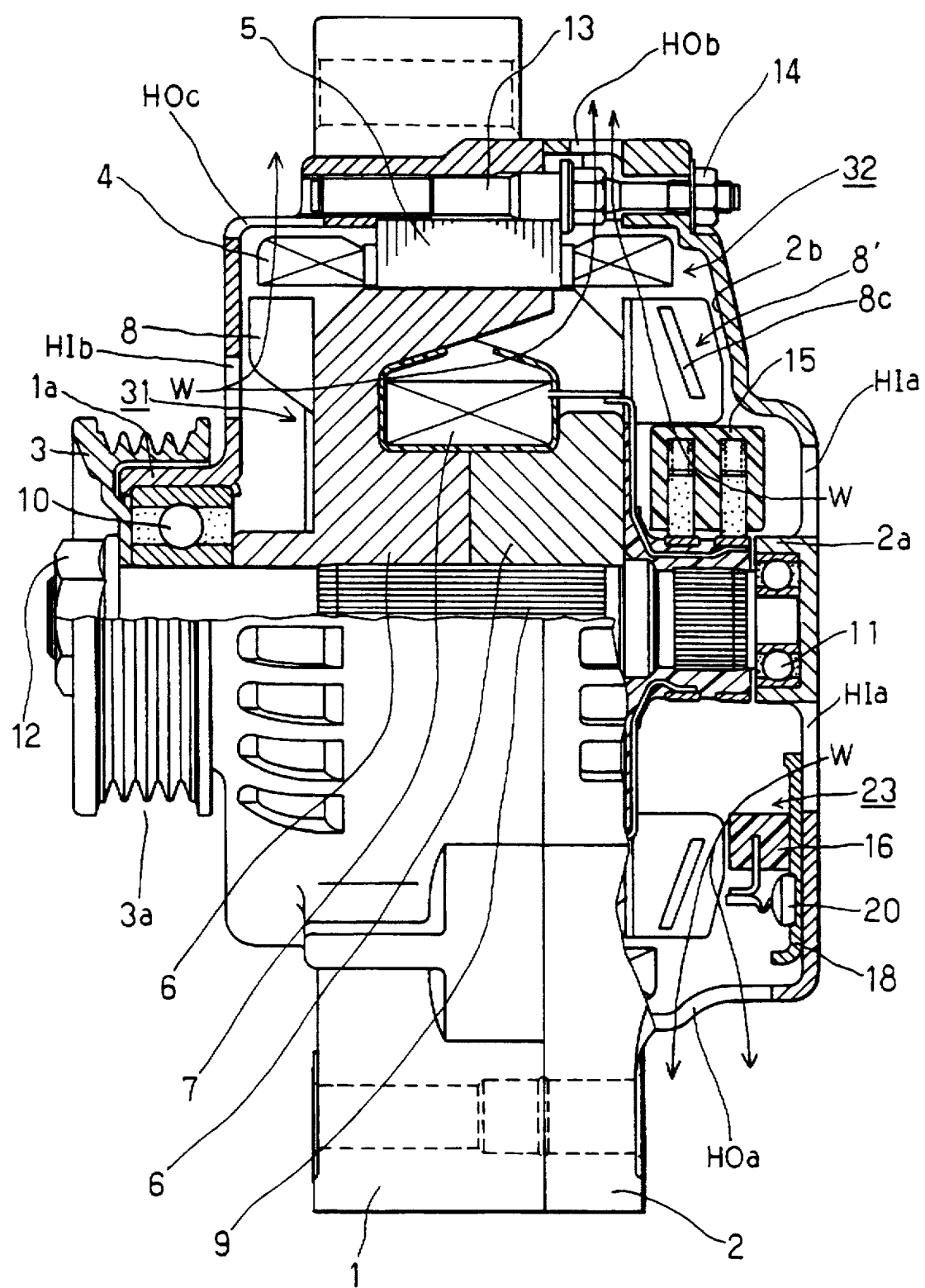
FIG. 1 is a cross-sectional overall view illustrating an alternator according to a first embodiment of the present invention.
Figure 2:
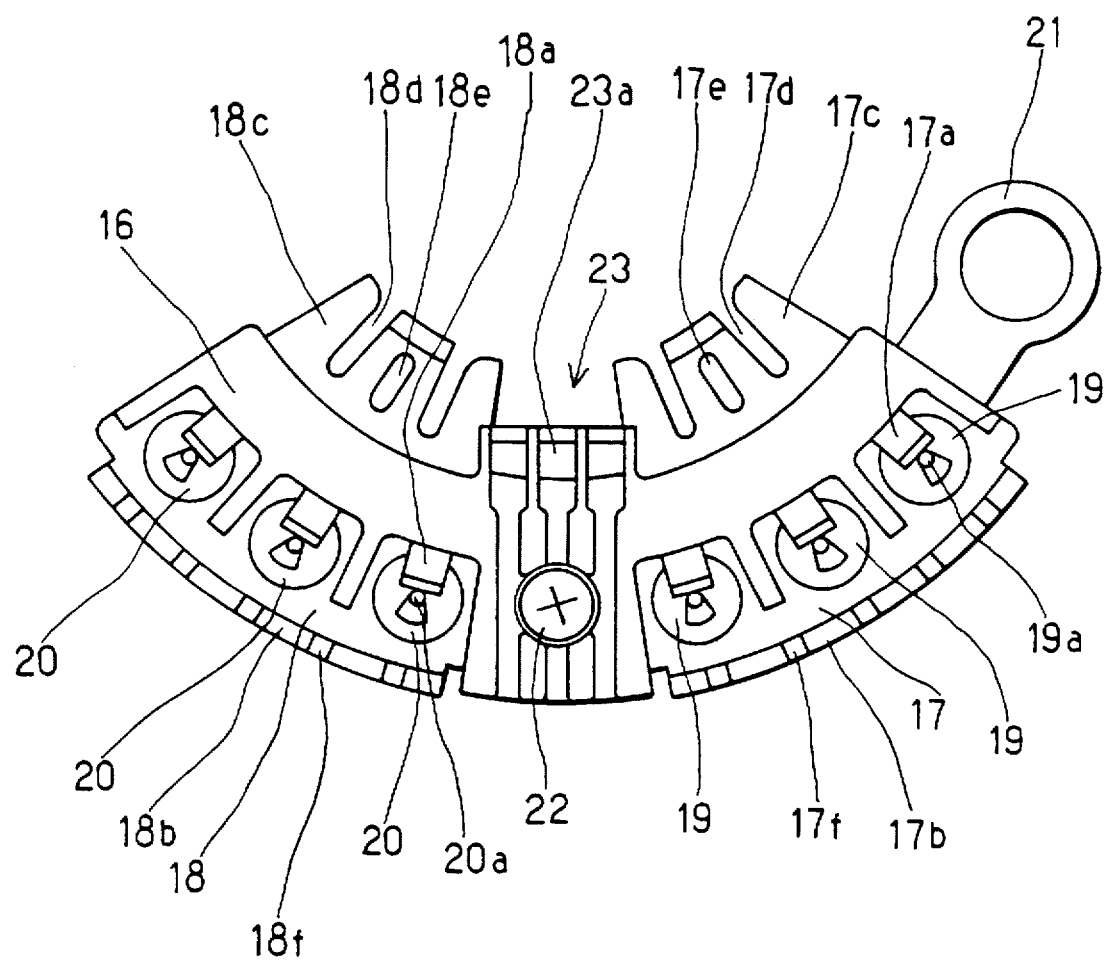
FIG. 2 is a plan view of the rectifying unit illustrated in FIG. 1.

As illustrated in FIG. 1, die-cast aluminum front and rear housings 1 and 2 are connected by a plurality of stud bolts 13 and nuts 14. The front housing 1 has a plurality of air intake windows HIb and air outlet windows HOc formed therein and the rear housing has intake windows HIa and air outlet windows HOa and HOb. The front and rear housings 1 and 2 respectively have boss portions 1a and 2a and a front bearing 10 is secured to the front housing boss portion 1a to carry a rotary shaft 9 rotatably with a rear bearing 11 which is secured to the rear housing boss portion 2a. The boss portion 1a extends forward from the front housing 1. The bearings 10 and 11 are press-fitted into the boss portions 1a and 2a and held by squeezing the boss portions 1a and 2a. The rotary shaft 9 is press-fitted into a pair of claw pole cores 6 (magnetic field cores) which has a field coil 7 therebetween. The end portions of rotary shaft 9 are respectively press-fitted to the inner members of the front and rear bearings 10 and 11. The rotary shaft 9 also carries a pulley 3 at its front end. The pulley 3 has a recess facing the front boss portion 1a in its central portion and rotates around the outer periphery of the boss portion 1a. The pulley 3 is tightly secured to the rotary shaft 9 by a pulley lock nut 12 in such a manner that a loading center of the pulley 3 is disposed at a distance, preferably between 2 mm and 8 mm, from a loaded center of the front bearing 10. A stator core (armature core) 5 is secured inside the front housing 1 around the claw pole core 6 and forms a stator 32 with a stator coil 4 of 2π/3 short pitch multi-phase windings disposed in slots of the stator core 5. A rectifying unit 23, a brush unit 15, a voltage regulator (not shown) and other electric parts are housed in the rear housing 2. F front and rear cooling fans 8 and 8' are respectively welded to the front (pulley side) and rear sides (counter pulley side) of the pole cores 6. The brush unit 15 is disposed radially inside of fan blades of the rear cooling fan 8. As shown in FIG. 2, the rectifying unit 23 consists of an arc-shaped terminal plate 16, a plus pole heat dissipating fin 17, a minus pole heat dissipating fin 18, plus pole diodes 19, minus pole diodes 20, terminals 17a and 18a, leads 19a and 20a, an output terminal 21 and a set screw 22. The plus-pole heat dissipating fin 17 and the minus-pole heat dissipating fin 18 are disposed on approximately the same circular plane and molded with a resinous insulating material into a unit with the terminal plate 16 and extend from inner and outer circumferences of the terminal plate 16. The plus-pole diodes 19, minus-pole diodes 20, the terminals 17a and 18a, and the leads 19a and 20a are disposed on the heat dissipating fins 17 and 18 radially outside of the terminal plate 16 to face the outside end portion of the blades of the cooling fan 8. The plus-pole heat dissipating fin 17 is fixed to the rear housing 2 close to the air intake windows HIa via an insulating member of the terminal plate 16 in a electrically insulated but heat conductive condition and the minus-pole heat dissipating fin 18 is fixed to the rear housing 2 at its inner flat portion directly to be grounded. The rectifying unit 23 has three connecting members 23a connecting the diodes and three phase wire ends of the stator coil 4 by way of soldering or welding. The plus-pole heat dissipating fin 17 may be fixed via a separate sheet of insulating material.

Elongations 17c and 18c extend from the heat dissipating fins 17 and 18 and face the cooling air intake windows HIa to be exposed to cooling air coming from the intake windows HIa.

Figure 5A:
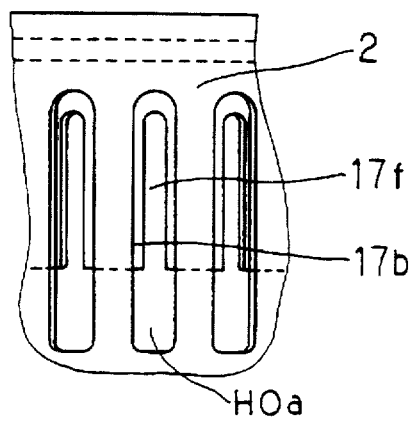
FIG. 5 A is a partial side view of a portion shown in FIG. 6
FIG. 5B is a partial view of a variation thereof.
Figure 5B:
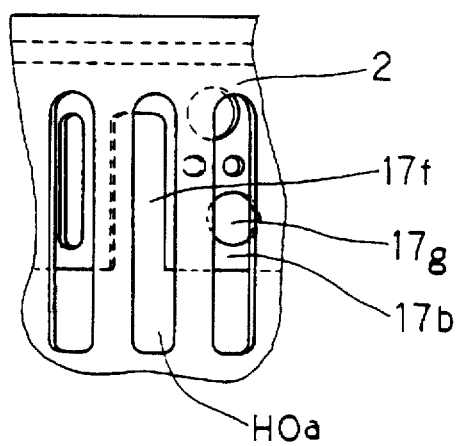
Figure 6:
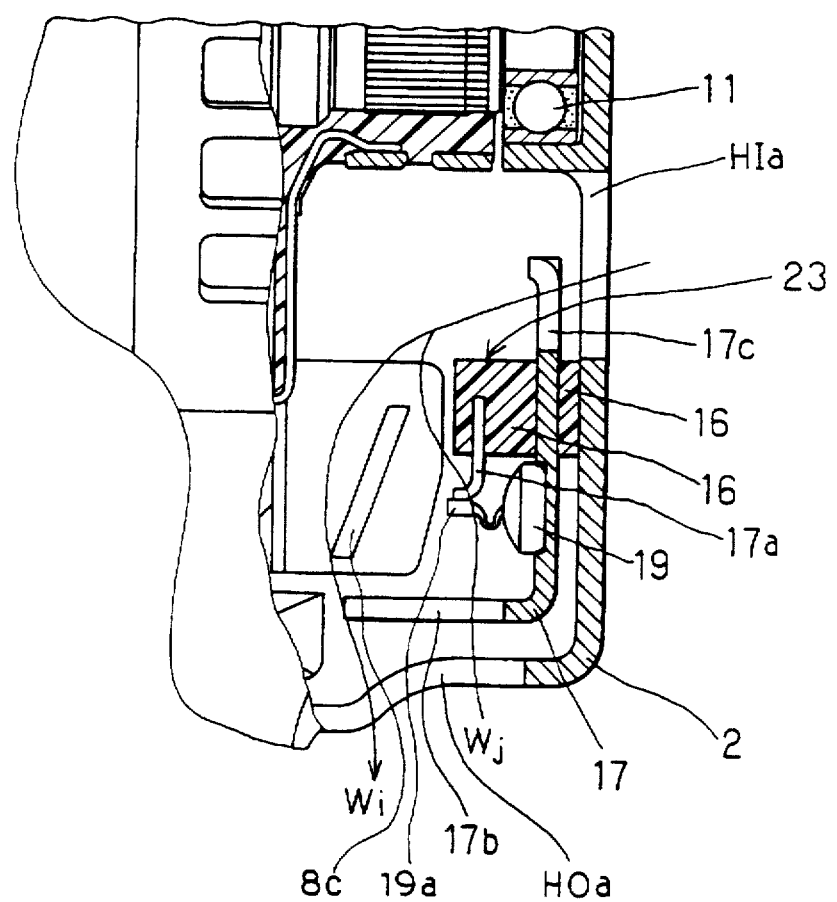
FIG. 6 is an enlarged cross-sectional side view illustrating a portion around a plus-pole fin shown in FIG. 1.

As shown in FIGS. 5A, 5B and 6, elongations 17b and 18b extend from the outer periphery of the heat dissipating fins 17 and 18 and bend toward the cooling fan 8' to have its direct cooling air blow thereon. The bending portions of elongations 17b of the plus-pole heat dissipation fin 17 are longer than the bending portions of the elongations 18b of the minus pole heat dissipating fin 18 so that the plus-pole heat dissipating fin 17 gets more cooling air than the minus-pole heat dissipating fin 18. The air outlet windows HOa are formed on the outer circumferential portion of the rear housing 2 around the cooling fan 8.

As shown in FIG. 2, slits 17d and 18d and through holes 17e and 18e are formed on the elongations 17c and 18c, and slits 17f and 18f are formed on the elongation 17b and 18b adjacent to the intake windows. Thus, a sufficient amount of the cooling air passes through those slits and through holes to enhance the cooling effect.

A hole 17g (shown in FIG. 5B) may be formed on the elongation 17b of the plus-pole heat dissipation fin 17.

Figure 3:
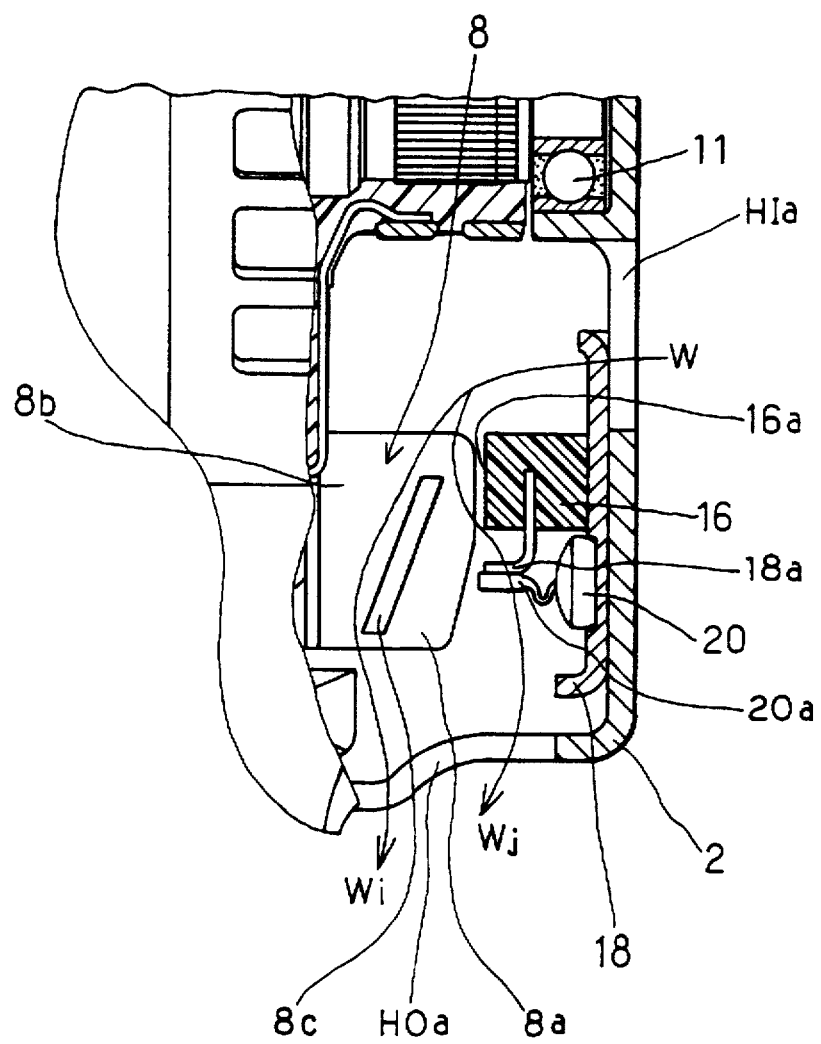
FIG. 3 is an enlarged cross-sectional view illustrating a portion around a minus-pole fin.
Figure 4:
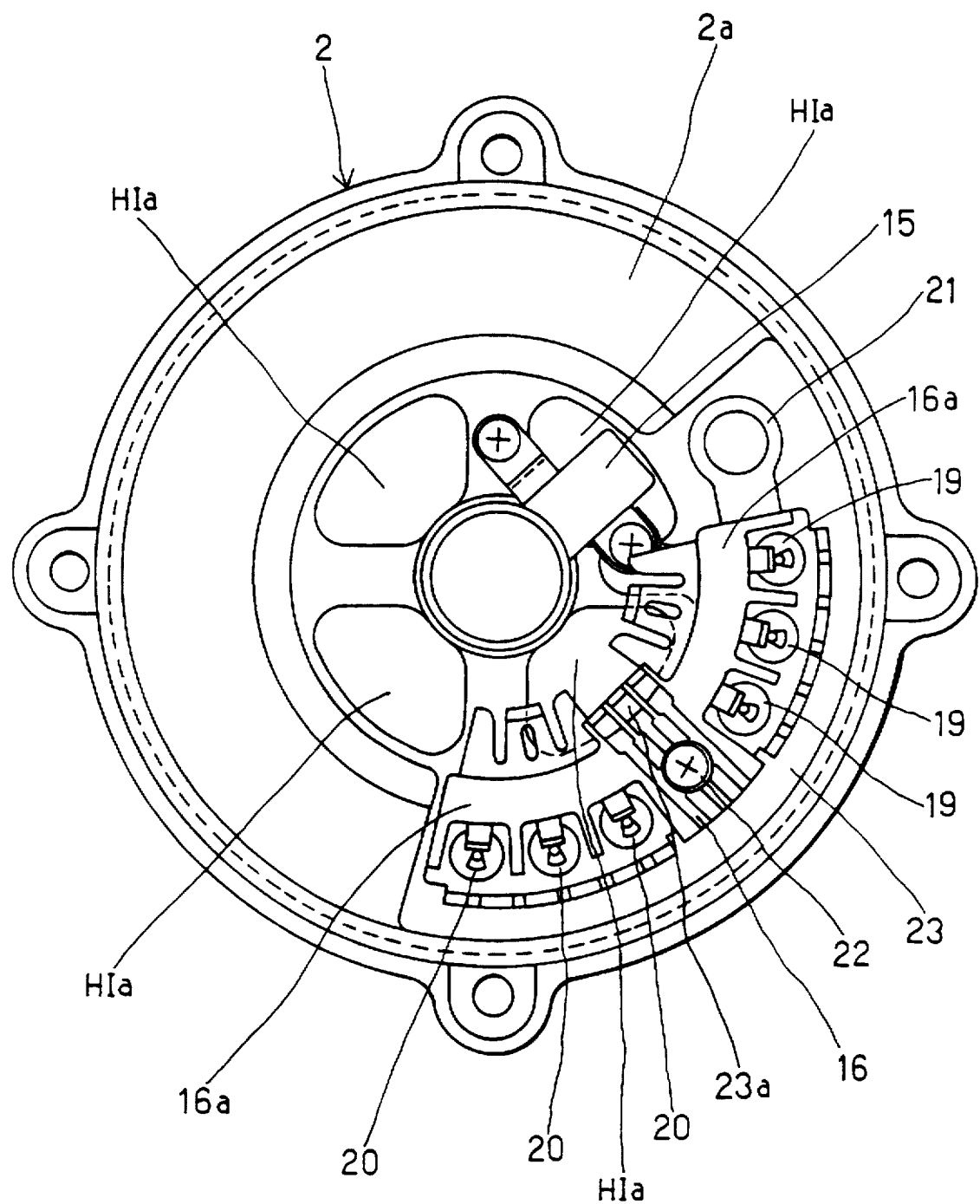
FIG. 4 is a plan view illustrating a rectifying unit installed in a rear housing 2 shown in FIG. 2.

Refering to FIG. 3, the cooling fan 8' is separated by the partition plate 8c and has first fan blades 8a generating a cooling air stream Wj toward the rectifying unit 23 and second fan blades generating a cooling air stream Wi toward other portions of the alternator. The partition plates 8a are molded integrally with the fan blades by resinous material. A shroud portion 16a is formed at a front surface of the terminal plate 16. Therefore, a relatively fast cooling air stream Wj is generated at a portion downstream of the terminal plate 16 and flows from the air intake window HIa to the air discharging window HOa.

As shown in FIG. 1, the brush unit 15 is disposed within the inner periphery of the fan blades. The brush unit 15 and a slightly slanted arc-shaped inner wall 2b of the rear housing 2 form another shroud portion on about the same circumferential plane as the shroud portion 16a of the terminal plate 16 between the ends of the terminal plate 16. In order to provide tolerance for installation, a gap formed between the shroud portion 2b and the fan blades is formed greater than the gap between the shroud portion 16a and the fan blades. The diodes 19 and 20, the leads 19a and 20a, the heat dissipating fins 17 and 18, and the terminals 17a and 18a are disposed in the path of the cooling air flow Wj. Since the shroud portion 16a of the terminal plate 16 and the rear housing shroud portion 2b are disposed on approximately the same plane without a big break, air turbulence is prevented and provision of a large amount of the cooling air is ensured.

In the alternator according to the embodiment described above, since the diodes which are heat sources and the heat dissipation fins 17 and 18 are exposed to the fan blades of the cooling fan 8 directly, a direct cooling air flow of a relatively large volume touches the rectifying unit 23 and cools the rectifying unit 23 directly.

Figure 7:
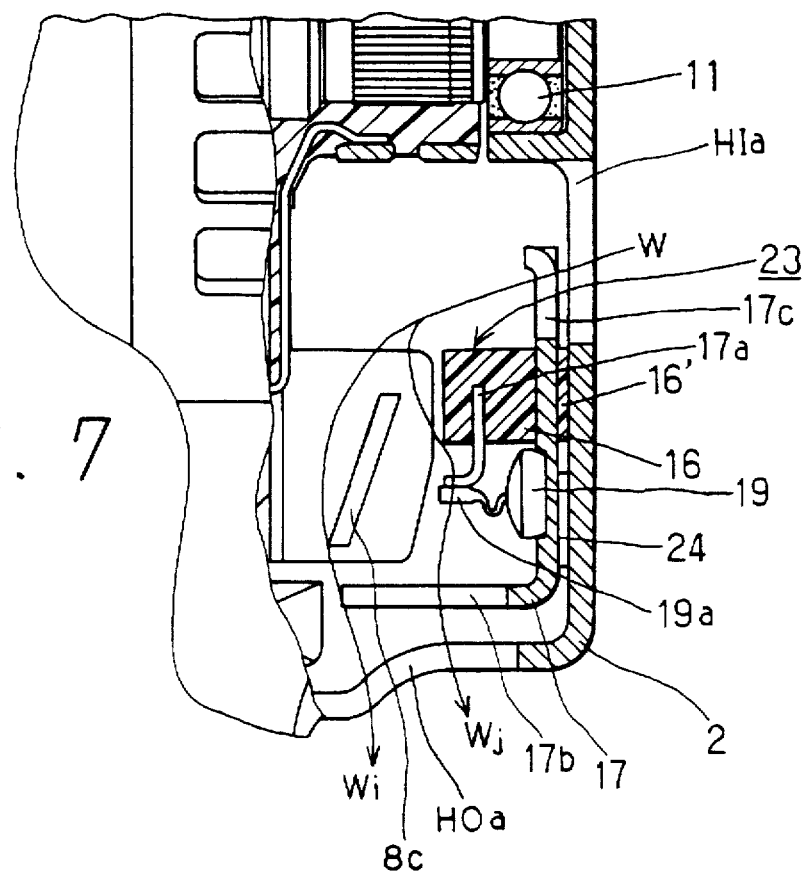
FIG. 7 is an enlarged cross-sectional side view illustrating a portion around a plus-pole fin of a second embodiment of the present invention.

Referring to FIG. 7, a second embodiment is described as follows. A plus-pole heat dissipating fin 17 is thermally connected to a housing 2 through a heat conductive electrically insulating material 24, such as ceramic coating or nylon containing heat conductive filler, so that heat generated in the plus-pole heat dissipating fin 17 is transmitted to the housing 2 in addition to being dissipated to the cooling air directly.

Figure 8:
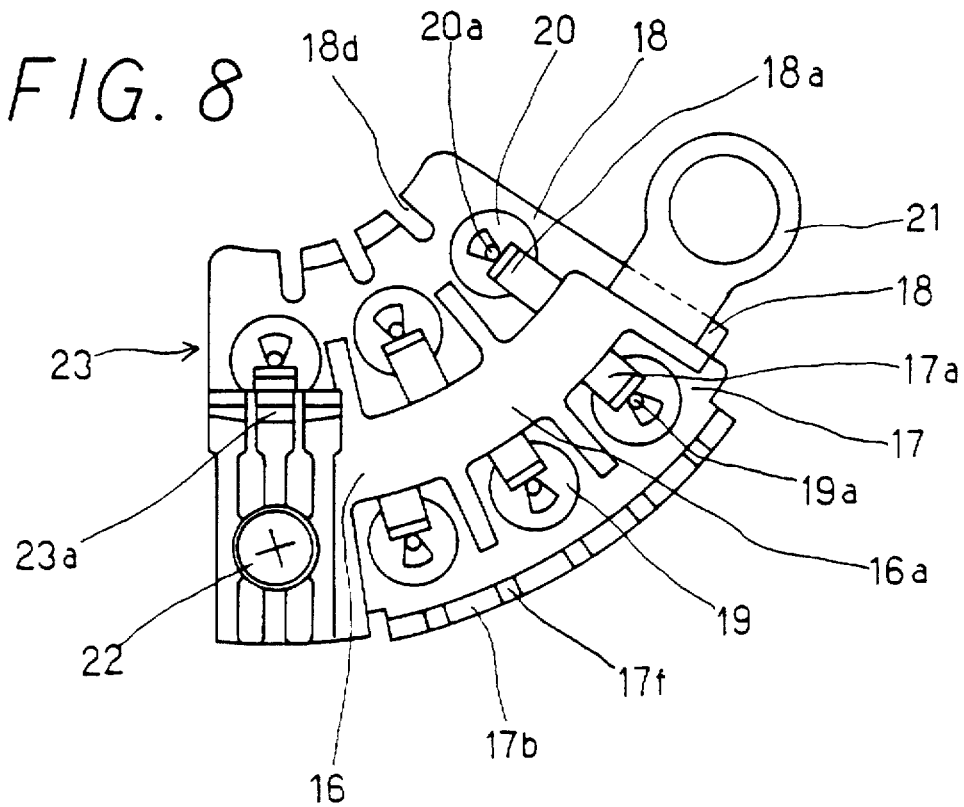
FIG. 8 is a plan view illustrating a rectifying unit of a third embodiment according to the present invention.
Figure 9:
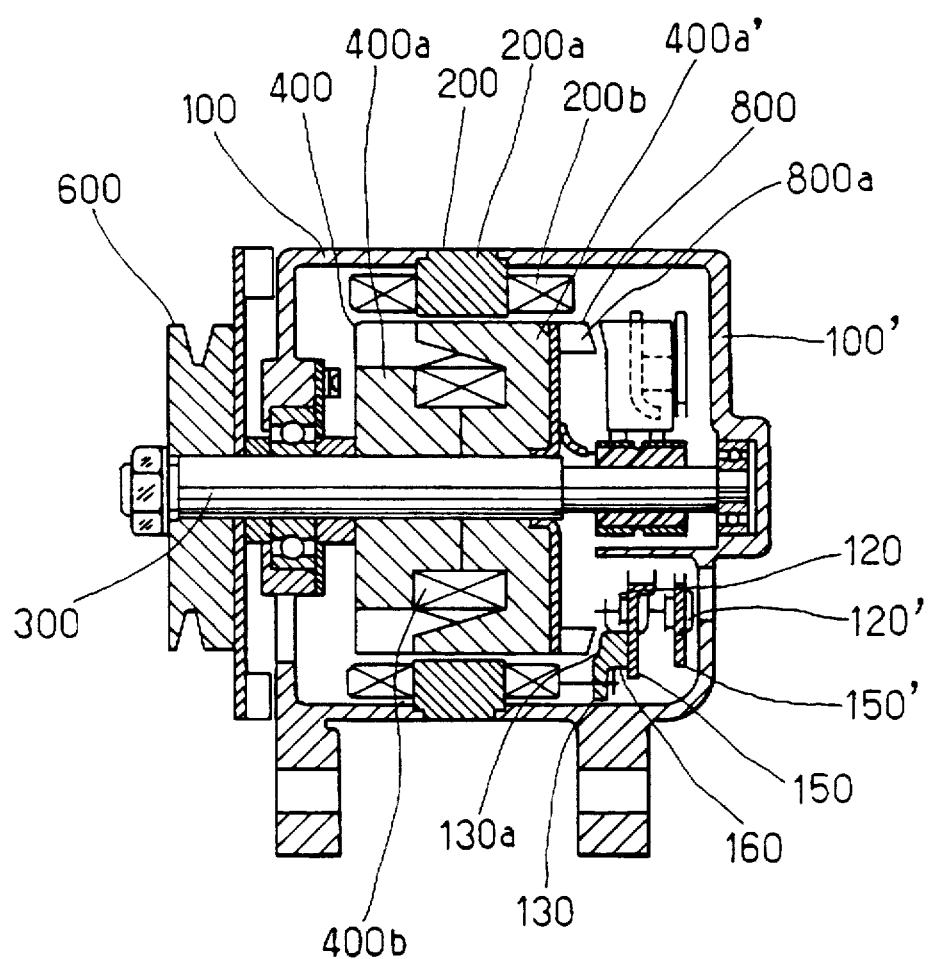
FIG. 9 is a cross-sectional side view illustrating a prior art alternator.
Figure 10:
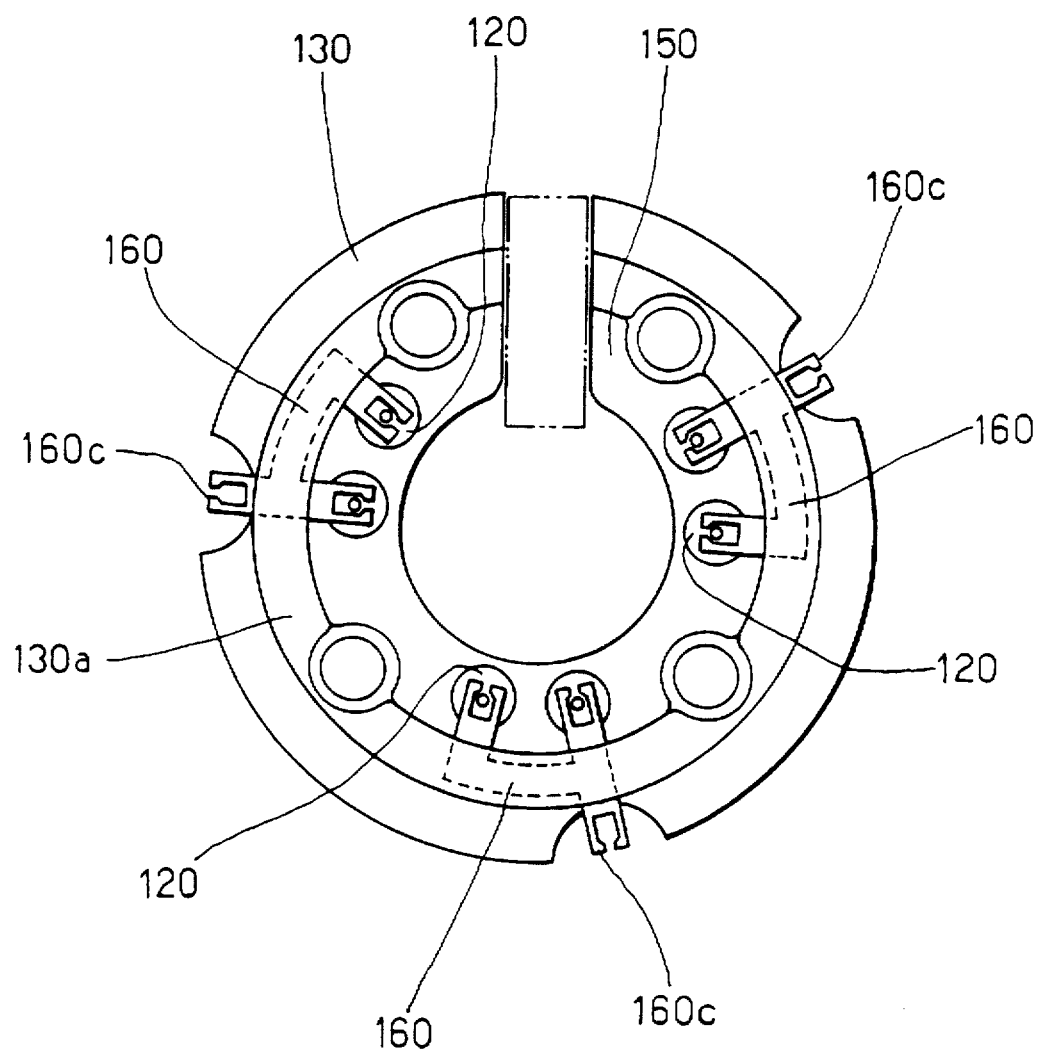
FIG. 10 is a plan view illustrating a rectifying unit of the prior art alternator shown in FIG. 9.

FIG. 8 shows a third embodiment of the present invention. In the third embodiment, a plus-pole heat dissipating fin 17 is put on top of a minus-pole heat dissipating fin 18 in the axial direction and molded into a unit integral with a terminal plate 16 so that the plus-pole heat dissipating fin 17 faces the cooling fan 8' and the minus-pole heat dissipating fin 18 is seated on the housing 2. The plus-pole heat dissipation fin 17 is disposed at a radially outer side of the terminal plate 16 and is formed with elongations 17b and slits 17f formed on its outer periphery. Plus-pole diodes 19 are soldered on the plus-pole heat dissipating fin 17. The minus-pole heat dissipating fin 18 is disposed at a radially inner side of the terminal plate 16 and has minus-pole diodes 20 mounted thereon. As a result, the installation space and size of the rectifying unit may be reduced while maintaining an adequate cooling capacity.

The front housing 1 and the rear housing 2, both made of die-cast aluminum, may be replaced by units made of press-formed iron plate or laser-machined iron block.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. An alternator for a vehicle comprising:

a rotor disposed about a shaft;

a cooling fan having fan blades and secured to a rear end of said rotor;

a front housing journaling said shaft;

a rear housing journaling said shaft and having a rear wall which includes a fan shroud portion adjacent an outer edge of said fan blades when rotated by said rotor, an air discharging window disposed at a portion around an outer periphery of said fan blades, and an air intake window; and a rectifying unit having diodes and heat dissipating fins, said rectifying unit being disposed between said outer edge of said fan blades and said rear wall of said rear housing, at least a portion of said heat dissipating fins having an elongation extending axially around said fan blades, said rectifying unit having a fan shroud member disposed on the opposite side of said shaft as said fan shroud portion and being adjacent said outer rear edge of said fan blades when rotated by said rotor, said fan shroud member forming with said fan shroud portion a generally common plane for decreasing air turbulence and increasing cooling air for said rectifying unit.

2. An alternator for a vehicle according to claim 1, wherein said heat dissipating fins comprises a plus-pole heat dissipating fin which is closely fixed to said rear housing through a heat-conducive electric insulator and a minus-pole heat dissipating fin.

3. An alternator for a vehicle according to claim 2, wherein said elongation of said plus-pole heat dissipating fin has an opening formed proximate to said discharging window.

4. An alternator for a vehicle according to claim 2, wherein said elongation of said plus-pole heat dissipating fin has an opening formed proximate to said discharging window.

5. An alternator for a vehicle according to claim 2, wherein at least one of said plus-pole and said minus pole heat dissipating fins has an opening formed proximate to said air intake windows.

6. An alternator for a vehicle according to claim 3, wherein at least one of said plus-pole and said minus pole heat dissipating fins has an opening formed proximate to said air intake windows.

7. An alternator for a vehicle according to claim 1, wherein said diodes are disposed to face an outer circumference of said end surface of said fan blades.

8. An alternator for a vehicle according to claim 2, wherein said diodes are disposed to face an outer circumference of said end surface of said fan blades.

9. An alternator for a vehicle according to claim 3, wherein said diodes are disposed to face an outer circumference of said end surface of said fan blades.

10. An alternator for a vehicle according to claim 2, wherein at least a part of said plus-pole heat dissipating fin and said minus-pole heat dissipating fin is disposed on top of the other in an axial direction thereof.

11. An alternator for a vehicle according to claim 3, wherein at least a part of said heat dissipating fins is disposed on top of the other in an axial direction thereof.

12. An alternator for a vehicle according to claim 2, wherein at least portions of said plus-pole and minus-pole fins are disposed in an air passage formed between said cooling fan and said air intake window.

13. An alternator for a vehicle according to claim 3, wherein at least portions of said plus-pole and minus-pole fins are disposed in an air passage formed between said cooling fan and said air intake window.

14. An alternator for a vehicle according to claim 1, wherein said cooling fan comprises second fan blades supplying cooling air to portions other than said rectifying unit, and said fan blades and said second fan blades are separated by a partition plate.

15. An alternator for a vehicle according to claim 2, wherein said cooling fan comprises second fan blades supplying cooling air to portions other than said rectifying unit, and said fan blades and said second fan blades are separated by a partition plate.

16. An alternator for a vehicle according to claim 3, wherein said cooling fan comprises second fan blades supplying cooing air to portions other than said rectifying unit, and said fan blades and said second fan blades are separated by a partition plate.

17. An alternator for a vehicle according to claim 14, wherein said fan blades and said second fan blades are integrally molded from resinous material.

18. An alternator for a vehicle according to claim 15, wherein said fan blades and said second fan blades are integrally molded from resinous material.

19. An alternator for a vehicle according to claim 16, wherein said fan blades and said second fan blades are integrally molded from resinous material.

20. An alternator for a vehicle comprising:

a rotor disposed about a shaft;

a cooling fan having fan blades and secured to a rear end of said rotor;

a front housing journaling said shaft;

a rear housing journaling said shaft and having a discharging window for cooling air driven by said cooling fan and a fan shroud portion as an integral part of said rear housing and being adjacent an outer rear edge of said fan blades when rotated by said rotor, said window being disposed at a portion corresponding to an outer periphery of said cooling fan; and a rectifying unit having a plus-pole dissipating fin facing said fan blades, a minus-pole heat dissipating fin connected thermally and electrically to said housing, said rectifying unit being disposed between said outer rear edge of said fan blades and said rear housing, said plus-pole heat dissipating fin being disposed adjacent said minus-pole, said plus-pole heat dissipating fin having an elongation extending axially around said fan blades, said rectifying unit having a fan shroud member disposed on the opposite side of said shaft as said fan shroud portion and being adjacent said outer rear edge of said fan blades when rotated by said rotor, said fan shroud member forming with said fan shroud portion a generally common plane for decreasing air turbulence and increasing cooling air for said rectifying unit.

21. An alternator for a vehicle according to claim 20, further comprising diodes mounted on said plus-pole heat dissipating fin and diodes mounted on said minus-pole heat dissipating fin, said diodes of said plus-pole heat dissipating fin and said diodes of said minus-pole heat dissipating fin being disposed to offset one another in a radial direction.

22. An alternator for a vehicle comprising:

a rotor having a shaft;

a pulley, carried by said shaft, having a recess and a loading center to which a driving force is applied;

a front housing having a front boss portion extending axially from said housing and inside of said recess of said pulley;

a front bearing secured inside of said boss portion, said front bearing having a loaded center to which a pulley belt tension is applied, said loaded center of said front bearing and said loading center of said pulley being offset from one another by a predetermined distance;

a cooling fan having first fan blades and secured to a rear end of said rotor;

a rear housing having an integral shroud portion disposed on an inner surface of said rear housing and disposed adjacent an outer edge of said fan blades when rotated by said rotor, an air discharging window disposed at a portion around an outer periphery of said fan blades, and an air intake window; and a rectifying unit having a plus-pole rectifying member, a minus-pole rectifying member and a terminal member holding said rectifying members in a unit, said plus-pole rectifying member having a plus-pole heat dissipating fin and first grouped diodes soldered thereto, said plus-pole heat dissipating fin having an elongation extending axially around said fan blades, said minus-pole rectifying member having a minus-pole heat dissipating fin secured and electrically connected to said rear housing and second grouped diodes soldered thereto, said terminal member having an electric conductor member connecting said first and second grouped diodes to said armature coil and a fan shroud member, said rectifying unit being secured to said housing between said outer edge of said fan blades and a rear wall of said housing between an end surface of said fan blades and a rear wall of said rear housing proximate to said air intake window in an axial direction thereof and between ends of said fan shroud member in a circumferential direction thereof, said fan shroud member being disposed on the opposite side of said shaft as said fan shroud portion and being adjacent said outer rear edge of said fan blades when rotated by said rotor, said fan shroud member forming with said fan shroud portion a generally common plane for decreasing air turbulence and increasing cooling air for said rectifying unit.

23. An alternator for a vehicle according to claim 22, wherein at least a part of said plus-pole heat dissipating fin is on top said minus-pole heat dissipating fin.

24. An alternator for a vehicle according to claim 22, wherein said cooling fan comprises second fan blades for supplying cooling air to portions other than said rectifying unit.

25. An alternator for a vehicle according to claim 24, wherein at least a part of said plus-pole heat dissipating fin is on top said minus-pole heat dissipating fin.

26. An alternator for a vehicle according to claim 24, wherein said fan blades and said second fan blades are integrally molded from resinous material.

27. An alternator for a vehicle according to claim 1, wherein said diodes are disposed on said respective heat dissipating fins at a certain interval and at least one of said elongations of said heat dissipating fins has a plurality of openings proximate to said discharging window at an interval which is shorter than that of said diodes.

28. An alternator for a vehicle according to claim 20, wherein said diodes are disposed on said respective heat dissipating fins at a certain interval and at least one of said elongations of said heat dissipating fins has a plurality of openings proximate to said discharging window at an interval which is shorter than that of said diodes.

29. An alternator for a vehicle according to claim 22, wherein said diodes are disposed on said respective heat dissipating fins at a certain interval and at least one of said elongations of said heat dissipating fins has a plurality of openings proximate to said discharging window at an interval which is shorter than that of said diodes.

30. An alternator for a vehicle as in claim 1 wherein said fan shroud member forms a gap with said outer edge of the fan blades when rotating, said gap being smaller than a gap between the outer edge of said fan blades when rotating and said fan shroud portion.

31. An alternator for a vehicle as in claim 1 wherein said generally common plane is substantially forward of an outer portion of said rear wall adjacent the journaling of said shaft.

* * * * *